United States Patent
Roehner et al.

(10) Patent No.: US 9,048,150 B1
(45) Date of Patent: Jun. 2, 2015

(54) TESTING OF SEMICONDUCTOR COMPONENTS AND CIRCUIT LAYOUTS THEREFOR

(71) Applicant: Infineon Technologies AG, Neubiberg (DE)

(72) Inventors: Michael Roehner, Munich (DE); Stefano Aresu, Munich (DE); Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/139,687

(22) Filed: Dec. 23, 2013

(51) Int. Cl.
*H01L 21/66* (2006.01)

(52) U.S. Cl.
CPC .......... *H01L 22/14* (2013.01); *H01L 22/30* (2013.01); *H01L 22/10* (2013.01)

(58) Field of Classification Search
CPC ......... H01L 22/10; H01L 22/14; H01L 22/30; H01L 22/32; H01L 22/34
USPC .............................. 438/10, 11, 14, 15, 17, 18
See application file for complete search history.

(56) References Cited

U.S. PATENT DOCUMENTS

| | | | |
|---|---|---|---|
| 7,298,159 B1 * | 11/2007 | Rozario et al. | 324/762.01 |
| 7,355,201 B2 * | 4/2008 | Zhu et al. | 257/48 |
| 2006/0234401 A1 * | 10/2006 | Slisher | 438/14 |
| 2009/0027074 A1 * | 1/2009 | Ko et al. | 324/763 |

* cited by examiner

*Primary Examiner* — Kevin M Picardat
(74) *Attorney, Agent, or Firm* — Slater & Matsil, L.L.P.

(57) ABSTRACT

In one embodiment of the present invention, a method of forming a semiconductor device includes performing a test during the forming of the semiconductor device within and/or over a substrate. A first voltage is applied to a first node coupled to a component to be tested in the substrate and a test voltage at a pad coupled to the component to be tested through a second node. The test voltage has a peak voltage higher than the first voltage. The component to be tested is coupled between the first node and the second node. A leakage current is measured through the component to be tested in response to the test voltage. After performing the test, the second node is connected to a functional block in the substrate. The first node is coupled to a third node coupled to the functional block.

31 Claims, 11 Drawing Sheets

TESTING OF SEMICONDUCTOR COMPONENTS AND CIRCUIT LAYOUTS THEREFOR

TECHNICAL FIELD

The present invention relates generally to testing, and more particularly to testing of semiconductor components and corresponding circuit layouts for testing.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

One of the challenges associated with semiconductor manufacturing relates to product yield and/or reliability. Consumers of semiconductor devices expect a certain level of reliability from their devices. This is even more critical when the semiconductor device is used in safety critical applications. However, a product may fail during its lifetime due to defects introduced during manufacturing.

Reliability issues may also result in failure of the process from being qualified, poor yield at the semiconductor device fabrication facility, and/or failure at the field, either of which may result in product recalls and/or loss in revenue. These problems become even more exacerbated in case of high voltage applications.

SUMMARY OF THE INVENTION

In accordance with an embodiment of the present invention, a method of forming a semiconductor device comprises performing a test during the forming of the semiconductor device within and/or over a substrate. A first voltage is applied to a first node coupled to a component to be tested in the substrate and a test voltage at a pad coupled to the component to be tested through a second node. The test voltage has a peak voltage higher than the first voltage. The component to be tested is coupled between the first node and the second node. A leakage current is measured through the component to be tested in response to the test voltage. After performing the test, the second node is connected to a functional block in the substrate. The first node is coupled to a third node coupled to the functional block.

In accordance with an embodiment of the present invention, a method of performing a test of a semiconductor device during fabrication comprises identifying a first pad of a component to be tested over a substrate. The component to be tested is configured to be coupled with a functional block in the substrate. The component to be tested is coupled between a first potential node and the first pad. The functional block is coupled between the first potential node and a second pad. A test voltage is applied at the first pad. A first voltage is applied at the second pad, and a second voltage is applied at the first potential node. A leakage current is measured in response to the test voltage. After the testing, the first pad is connected to the second pad.

In accordance with an embodiment of the present invention, a method of testing a semiconductor device, the method comprises providing a substrate comprising a plurality of semiconductor devices. A first device of the plurality of semiconductor device comprising a first circuit is coupled to a first line and a second circuit is coupled to a second line. An inline test is performed on a semiconductor device. The inline test comprises applying a first potential at the first line and a different second potential at the second line. A leakage current is measured through the first line. The method further includes determining whether the first device passed or failed the inline test based on the measured leakage current.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 4, which includes

FIG. 6, which includes

FIG. 10, which includes

FIG. 15 illustrates applying embodiments of the present invention to metal line structures, wherein FIG. 15 illustrates a top view of two metal lines formed in a same metal level.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in specific contexts, namely circuit elements such as capacitors. Embodiments of the invention may also be implemented in other semiconductor applications involving closely spaced metal lines such as memory devices, logic devices, analog devices, radio frequency (RF) devices, digital devices, and other applications that utilize metal lines, for example.

In various types of capacitors, the distance between the capacitor plates is a critical factor especially when supporting a large capacitance at high voltages. This is because a large potential difference develops across the dielectric layer between the capacitor plates. The potential difference can result in a subsequent fail, which may be present before product operation, or may develop during product lifetime. However, present testing methodology cannot identify these defects. For example, conventional methods such as detecting a leakage current by applying a voltage between the capacitor plates may not find any difference between a part that fails subsequently and a part that will not fail. In various embodiments, the present invention teaches a method, a design, and a device to overcome these and other problems.

Figure 1A:
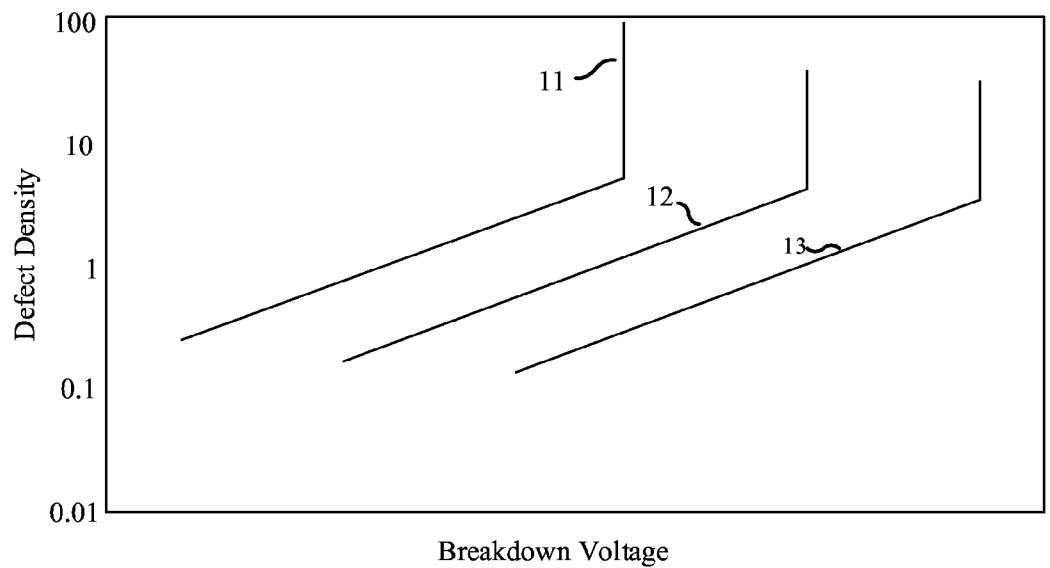
FIGS. 1A and 1B, illustrates defect density associated failure of different capacitor structures.
Figure 1B:
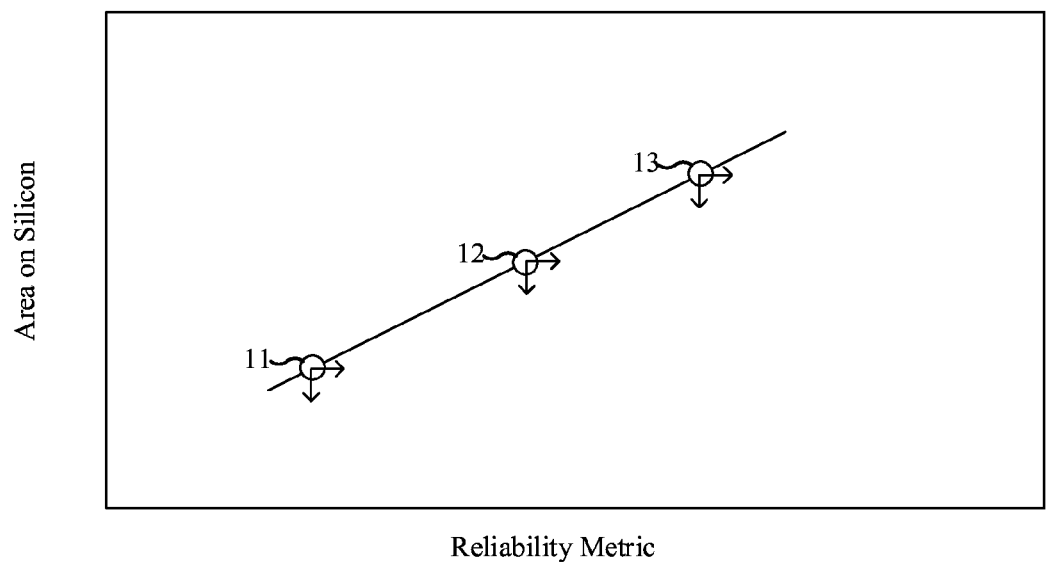

FIG. 1, which includes FIGS. 1A and 1B, illustrates defect density associated failure of different capacitor structures.

Failure rate targets for various semiconductor process technologies such as those used to produce automotive components are increasingly becoming more stringent. For example, failure rates below 1 ppm are expected for many applications. On the other hand, higher voltages are used in many technologies, which increases the propensity for failure especially in regions where a high voltage line runs parallel to a low voltage line. Back end of the line (BEOL) metal lines, which may include capacitors, have difficulty meeting these stringent reliability requirements solely by technological improvements because reliability may be determined by extrinsic defect density levels, which may not be well controlled by the semiconductor device manufacturer. For example, a dust particle may become deposited onto the metal lines shorting them. Alternatively, for example, process variations may result in forming pockets of dielectric with poor isolation, narrowing/widening of metal lines, depositing particles that introduce a lower quality dielectric path between adjacent metal lines or between the electrodes of the capacitor.

Referring to FIG. 1A, break down characteristics of two different capacitor structures are illustrated using a first curve 11 and a second curve 12. The first curve 11 is representative of a first capacitor separated by a first gap (inter-metal distance) while the second curve 12 is representative of a second capacitor separated by a second gap. Similarly, the third curve 13 is representative of a third capacitor separated by a third gap. In the illustration, the first gap of the first curve 11 is smaller than the second gap of the second curve 12, which is smaller than the third gap of the third curve 13. The shallower branches of the curves (lower slope) are related to extrinsic breakdowns, while the steeper part of the curves is due to intrinsic failures.

The extrinsic breakdown may be a result of process defects such as introduction of particles, variations in metal line widths, quality of dielectric, and others. The intrinsic breakdown may be a result of the breakdown of the dielectric between the capacitor plates. Accordingly, the breakdown in isolation between the capacitor plates, which occurs at much lower voltages, is due to extrinsic breakdown rather than the intrinsic breakdown of the dielectric. Consequently, for a given defect density, the first curve 11 fails at a lower voltage than the second curve 12 illustrating that the smaller gap distance has a higher probability of failure.

In other words, as illustrated in FIG. 1B, increasing the gap (as described above curve 13 has the largest gap while curve 11 has the smallest) improves the reliability (improvement going from left to right on the x-axis of FIG. 1B). Increasing the gap lowers capacitance, which has to be compensated by increasing plate area. There is, therefore, an area penalty associated with this improvement, which increases the fabrication costs. Thus, there is a trade-off between improvements in reliability versus the area consumed. Furthermore, for FEOL capacitors the increase of dielectric thickness is usually not possible because the electrical parameters of transistors would also change. In particular, a given process may be constrained to move along the line illustrated in FIG. 1B. It would be advantageous to break this trade-off (shown by the small arrows). Embodiments of the present invention break this trade-off by identifying susceptible chips in a cost effect way, without consuming as much area as the above trade-off.

Another way of improving reliability is to use a burn-in to screen out devices with the extrinsic defects. However, burn-in is a process in which a voltage slightly higher than operating voltage is used at a higher temperature for a long time. The applied voltage, although higher than operating voltage, is restricted to avoid complete breakdown of the other devices being stressed simultaneously. Therefore, the testing is performed by applying a stress voltage for a long time period (many hours). Additionally not all lines, such as capacitors between one or more floating nodes, are accessible by a burn-in process.

Figure 2:
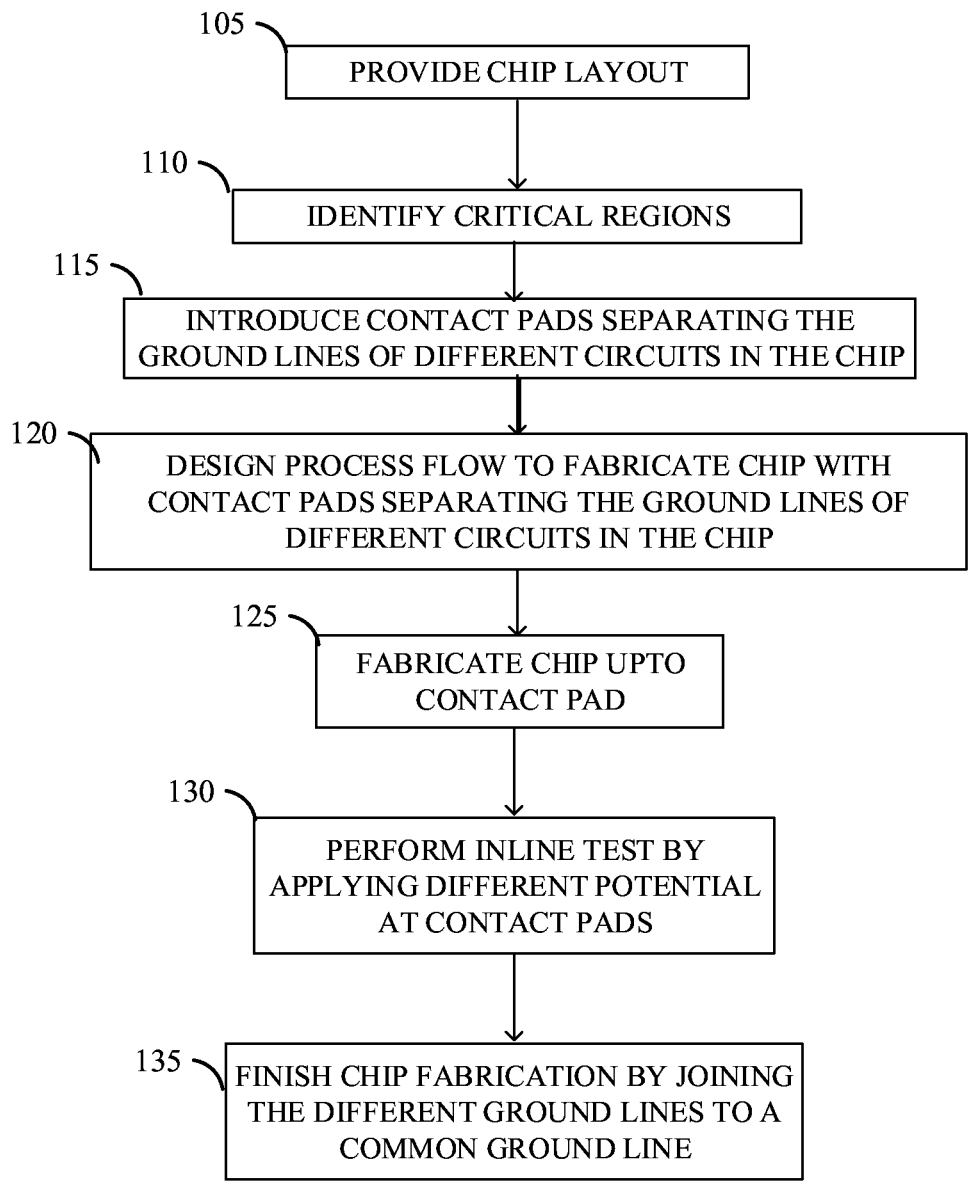
FIG. 2 illustrates a flow chart of implementing the diagnostic method described in various embodiments of the present invention.

There is no solution so far available for technologies with stringent (particles per million) ppm target, for example, less than a few ppm. To meet functional safety requirements, for example, where a short between different voltage domains is critical, area and time consuming measures are used, which are expensive. FIG. 2 illustrates a flow chart of implementing the diagnostic method described in various embodiments of the present invention.

Referring to FIG. 2, the chip layout is provided in a first step 105. The chip layout may include the layout of the metallization layers and capacitors, and may also include information regarding the lines carrying high voltages.

Next, the layout is analyzed to identify critical regions or circuits to be tested (second step 110). These circuits may include components that are coupled between two floating voltages, for example. As an example, the circuit may be capacitor having a large capacitance in which one of the plates is coupled to a very high voltage line.

In various embodiments, a predefined gap distance (distance between the capacitor plates) may be used to identify capacitors of the layout that are susceptible to process variations. In another embodiment, the gap distance may be normalized by the electric field across the dielectric layer of the capacitor. For example, in circuits having capacitors tied to different voltages, the gap distance may be normalized (e.g., by dividing the voltage across the plates by the gap distance) to determine capacitors of the layout in which the electric field exceeds a certain critical number. Further, in various embodiments, more complicated schemes or rules may be used to identify the capacitance and other structures to test.

Next, as illustrated in FIG. 2, in the third step 115, the contact pads are introduced so that the components identified in the prior step may be individually tested. For example, the ground line of the circuit to be tested is separated from the ground line of adjacent circuitry to which the circuit to be tested is connected. The contact pads perform no function during operation of the chip. Rather, as described further below, the contact pads are test structures to identify defects introduced during processing. Further, the contact pads may not be formed on the upper most metallization layer in some embodiments. Rather, they may be formed in any intermediate metallization layer, for example, metal one, metal two, and so on.

Referring to the fourth step 120, a process flow is generated to fabricate a semiconductor chip with the contact pads. In particular, in the process flow, the components to be tested are isolated from other adjacent circuitry. They are eventually connected together after completing the inline test including the test program for testing the component is inserted. The contact pads are introduced so as to divide the common ground line or common supply line in some embodiments.

Using the designed process, fabrication of the semiconductor chip proceeds up to at least the contact pads (fifth step 125). At this point, an inline test is performed (sixth step 130). In some embodiments, the inline test may be the first inline test after forming the front end device regions, for example, performed after metal one or metal two. Alternatively, in other embodiments, the inline test may be a higher level metal test, for example, after forming metal four or metal six. The inline test is performed across all the devices (chips being fabricated) on the semiconductor wafer and may be performed simultaneously in some embodiments.

Inline testing may include applying a bias through the contact pads and measuring a leakage current produced in response to the bias at the contact pads. After performing the inline test, the separated ground lines and/or supply lines are connected back together so that a single line may be used during the operation of the chip. The fabrication of the chip is completed (seventh step 135), for example, by forming subsequent upper level metallization, back side metallization (if needed), singulation, and other processes.

Figure 3:
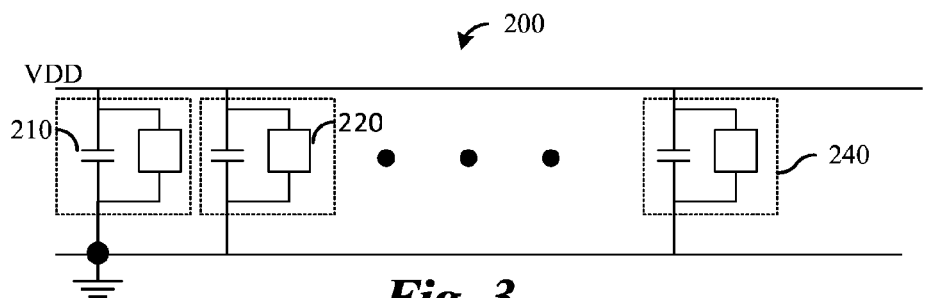
FIG. 3 illustrates a conventional circuit comprising a plurality of functional blocks connected between a supply voltage and a ground potential.

FIG. 3 illustrates a conventional circuit 200 comprising a plurality of functional blocks 240 connected between a supply voltage VDD and a ground potential. Each functional block 240 may include a capacitor 210 and a circuit block 220. The capacitor 210 is coupled in parallel with the circuit block 220 in this illustration. However, even in this case, it is not possible to test the capacitor at a higher voltage because the higher voltage would also be applied at the circuit block 220, which may be damaged. Therefore, conventional tests involve a burn-in process in which the temperature is increased while the test voltage is slightly higher than the typical supply voltage. For example, the test voltage may be higher than the supply voltage by about 20% to about 100% during the burn-in process.

Figure 4A:
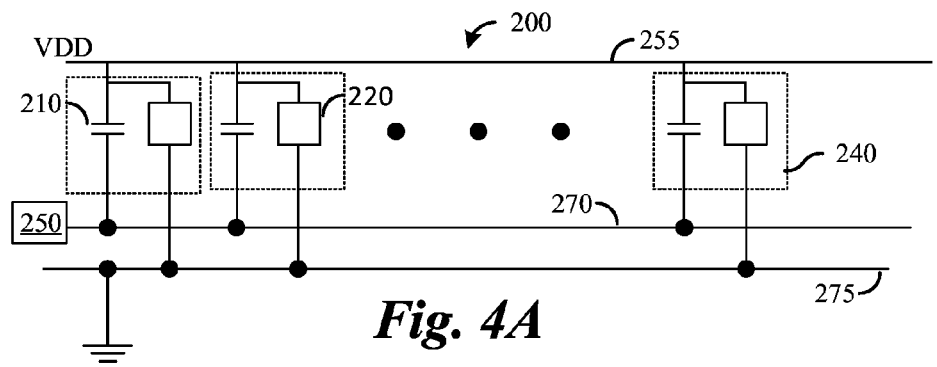
FIGS. 4A and 4B, illustrates a circuit during and after testing in accordance with an embodiment of the present invention.
Figure 4B:
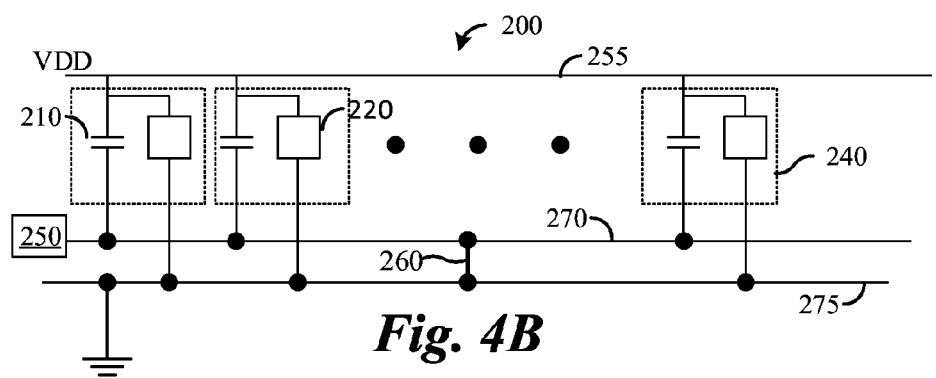

FIG. 4, which includes FIGS. 4A and 4B, illustrates a circuit during and after testing in accordance with an embodiment of the present invention.

Referring to FIG. 4A, in one embodiment, a contact pad 250 is introduced to separate the ground connection of the capacitor 210 from the circuit block 220. FIG. 4A also illustrates a separated ground line 270 and a ground line 275.

For example, during inline testing, a high voltage, e.g., pulse, may be safely applied at the contact pad 250 without damaging the circuit block 220. In one embodiment, a negative voltage may be applied at the contact pad 250. During the testing, the potential at the supply line 255 may be maintained at ground voltage. Further, the potential at the ground line 275 may be also maintained at ground voltage. Therefore, using embodiments of the present invention, no potential is applied across the circuit block 220 during the testing of the capacitor 210. The leakage current measured through the contact pad 250 is indicative of the quality of the dielectric separating the plates of the capacitor 210. In various embodiments, the ratio of magnitude of a peak voltage of the test voltage and the magnitude of a supply voltage configured to be applied at the first potential node during operation is between 1.1:1 to about 10:1.

In various embodiments, the capacitor 210 may be any type of capacitor such as a vertical parallel plate capacitor, a gate oxide capacitor, an O/N/O capacitor, a poly to poly capacitor, trench capacitors, and others.

In various embodiments, the testing may be a part of an inline parameter test on wafer level, for example, as part of tests used for monitoring process control, reliability control, and others. Further, this test is very efficient since a very high voltage (even a short pulse) may be sufficient to produce a reliable test measurement. Therefore, the stress time may be made very short, for example, to a few milliseconds, in contrast, to many hours using conventional testing methods. For power applications, in some embodiments, the parameter test may be performed before processing the last power metal stack.

Further, after performing the inline testing, as next illustrated in FIG. 4B, the separated lines are joined together. For example, as shown in FIG. 4B, the ground connection of the capacitor 210 is joined with the ground connection of the circuit block 220 through an interconnect 260. For example, an upper metal layer may be used to connect the two ground lines together. The interconnect 260 may be implemented as a jumper in various embodiments. Accordingly, after this joining of the different ground lines, the circuit 200 of FIG. 4B functions identical to the corresponding circuit 200 illustrated in FIG. 3.

Figure 5:
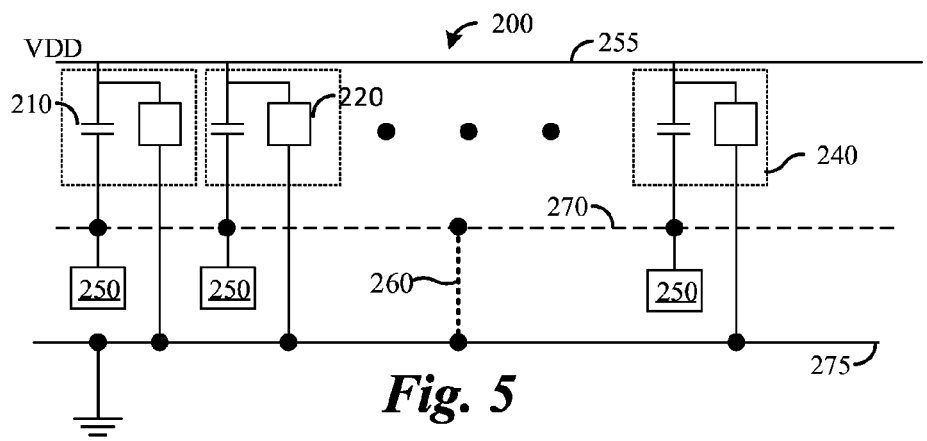
FIG. 5 illustrates a circuit having multiple pad for separating the ground line of adjacent components into a plurality of ground lines in accordance with an alternative embodiment of the present invention.

FIG. 5 illustrates a circuit having multiple pad for separating the ground line of adjacent components into a plurality of ground lines in accordance with an alternative embodiment of the present invention.

In this embodiment, the ground line for one or more capacitors 210 may be separated into multiple contact pads 250. This embodiment may be used to avoid a long ground line with a higher ohmic resistance, which would degrade the sensitivity of the measurement. Additionally, in this embodiment, different components may be tested using different voltage pulses at the contact pads 250. As illustrated in FIG. 5, the interconnect 260 and the separated ground line 270 may be formed in an upper metallization layer after performing the inline test.

Embodiments of the present invention have several advantages. The applied voltage may be very high because all the other devices, such as the circuit block 220, are completely isolated during the application of the test voltage pulse at the contact pad 250 except for the OV applied at the supply line 255. Due to the higher voltages that can be used during testing, this type of testing is very effective in detecting potential failure and much less expensive than a burn-in. Additionally, the testing time is very small and therefore is not expensive.

Also, a failure may be easily detected without rerunning the functional test because of the reliable leakage detection during the application of the voltage pulse. The leakage detection can be very sensitive because very low currents may be detected due to the absence of other leakage or noise from the circuit block 220. Accordingly, even weak devices, that would otherwise pass functional tests, may be detected.

Advantageously, circuit blocks or components such as the capacitor 210 that may not be tested independently during operation may be tested individually because the ground pads are separated during the inline testing.

By applying the embodiments of the present invention to test critical components during manufacturing in a cost effective manner, safety goals of safety critical applications may be achieved without a significant increase in manufacturing costs.

In various embodiments, applying embodiments of the invention, for example, by separately testing critical components and joining them later in an upper metallization, may be used to produce capacitors with greater nominal capacitance but with greater reliability and lower costs. Embodiments of the present invention may have a major impact on the automotive and industrial applications that require excellent reliability and involved in safety critical applications.

FIG. 6, which includes FIGS. 6A-6D, illustrates an alternative embodiment of a method of performing an inline testing in accordance with an embodiment of the present invention.

Figure 6A:
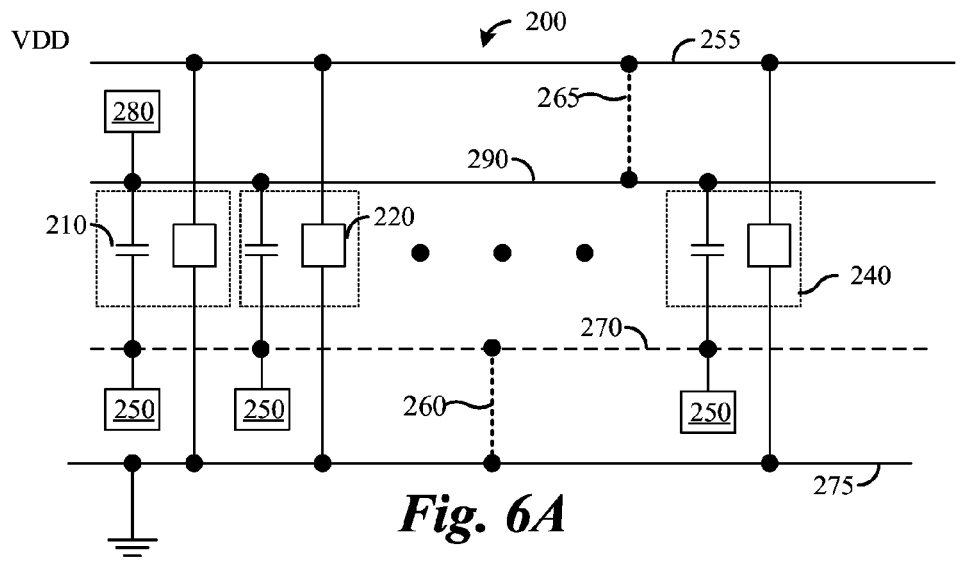
FIGS. 6A-6D, illustrates a method of performing an inline testing in accordance with an alternative embodiment of the present invention.
Figure 6B:
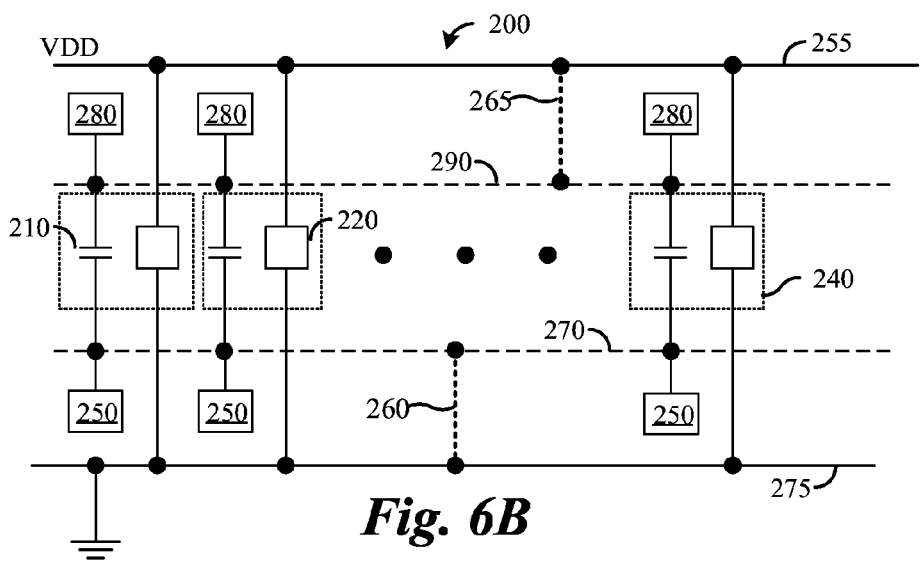

In this embodiment, each of the capacitor 210 may be tested separately because both the supply line and the ground line between the capacitors 210 are separated. In one embodiment, as illustrated in FIG. 6A, the separated supply line 290 may be connected to a common supply pad 280. In this embodiment, after the inline testing, the interconnect 260, the common ground line 270, and the supply side interconnect 265 are formed in an upper metallization level. Alternatively, in another embodiment, as illustrated in FIG. 6B, each of the capacitors 210 is coupled to a separate contact pad 250. In this embodiment, after the inline testing, the interconnect 260, the ground line 270, the separated supply line 290, and the supply side interconnect 265 are formed in an upper metallization level.

Figure 6C:
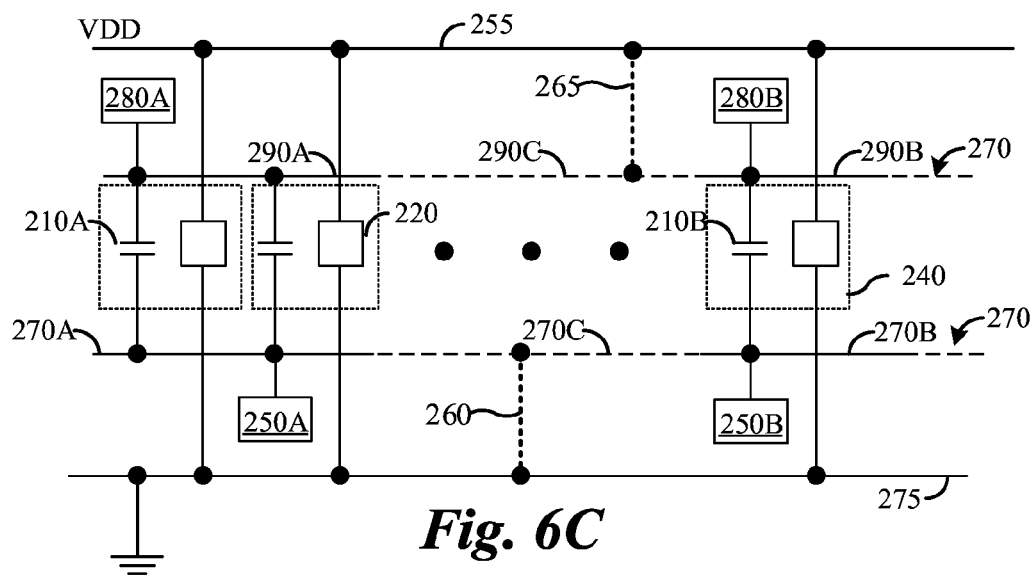

In a further embodiment, as illustrated in FIG. 6C, a smaller grouping of capacitors 210 may be coupled to a common pad. For example, first capacitors 210A may have different characteristics from second capacitors 210B. Hence, the test pulse voltage for testing the first capacitors 210A may be different from the test pulse voltage needed for testing the second capacitors 210B. Consequently, either the supply side and/or the ground side is separated and grouped together so that a smaller group of capacitors 210 may be tested simultaneously. In FIG. 6C, the ground line is separated into a first ground line section 270A, a second ground line section 270B, and a third ground line section 270C. At the time of the testing only the first ground line section 270A, and the second ground line section 270B have completed fabrication. Thus, the third ground line section 270C is not yet formed, which isolates the first capacitor 210A from the second capacitor 210B.

Similarly, if needed, the supply side may also be separated into multiple sections. Hence, at the time of the testing only the first supply line section 290A, and the second supply line section 290B has been fabricated. During testing, each group of capacitors is coupled to a separate ground side contact pad 250A or 250B and a separate supply side contact pad 270A or 270B. After performing the testing, the upper metallization is formed over the capacitors, which interconnects the various supply side lines and the ground side lines together. For example, the third ground line section 270C and the interconnect 260 is formed, which forms a common ground line. Similarly, a third supply line section 290C and supply side interconnect 265 are formed in an upper metallization level, which couple all the capacitors and the circuit blocks 220 to the common supply line.

Figure 6D:
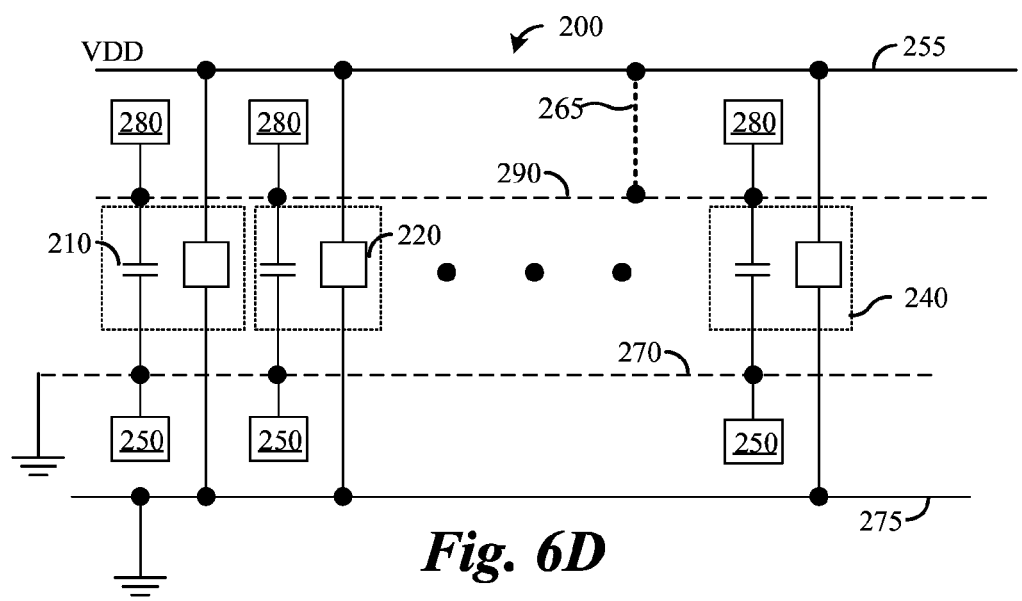

FIG. 6D illustrates an alternative embodiment in which two separate ground lines are used. This embodiment may be used to minimize ohmic loss through the ground lines.

Figure 7:
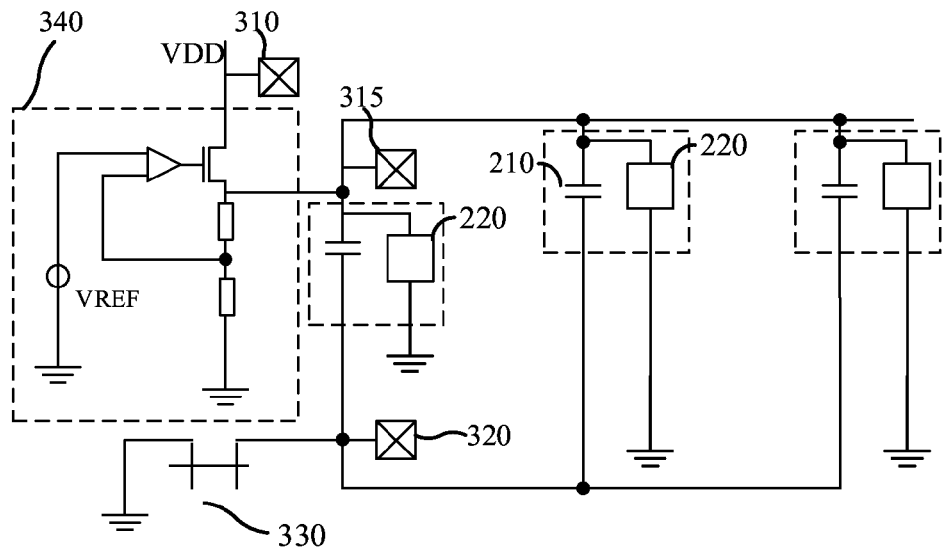
FIG. 7 illustrates inline testing of buffer capacitors in an application having supply rails with buffer capacitors in accordance with an embodiment of the present invention.

FIG. 7 illustrates inline testing of buffer capacitors in an application having supply rails with buffer capacitors in accordance with an embodiment of the present invention.

Supply rails are large distributed nets, and therefore test pads may be easily added without area penalty. In this embodiment, all buffer capacitors are connected to a separate contact pad, which is subsequently connected to a common ground line after performing the inline testing.

As illustrated in FIG. 7, a capacitor 210 that is being tested is coupled between a supply side pad 310 and a ground side pad 320. The supply side pad 310 may be coupled to ground during the inline testing so that functional circuit blocks 220 and the power regulator 340 are not impacted during the testing. A large negative voltage pulse may be applied safely at the ground side pad 320 without damaging the functional circuit blocks 220 and the power regulator 340. For example, the operating voltage of the circuit blocks 220 may be less than 5V while a large negative test pulse, e.g., −12V may be applied at the ground side pad 320. Thus, during the testing, all inputs of the both the functional circuit blocks 220 and the power regulator 340 are biased between ground potential. Consequently, during the testing, no current is flowing through the supply side pad 310 and the ground side pad 320 except for the leakage current through the capacitors 210.

Additionally, in further embodiments, another supply side contact 315 may be used to ground the floating node coupled to the capacitors 210. This will improve the detection of the leakage current as the current measurement is not impacted by the transistor circuit in the power regular 340.

FIG. 7 further illustrates the jumper 330, which is used to join the separate ground lines together after the completion of the inline testing. After the jumper 330 is connected, the capacitor ground of the capacitors 210 is coupled to the ground of the functional circuit blocks 220. Thus, a common ground line is used during the operation of the circuit.

Figure 8:
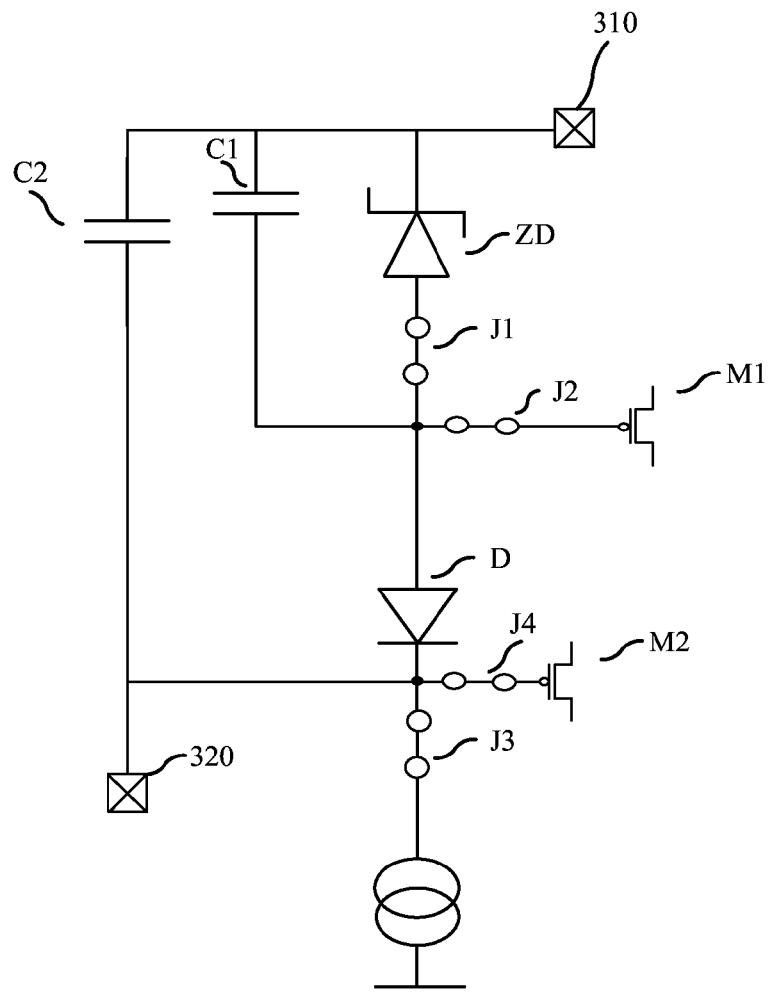
FIG. 8 illustrates an application for testing floating blocks in accordance with an embodiment of the present invention.

FIG. 8 illustrates an application of the embodiment of the present invention for testing floating blocks in accordance with an embodiment of the present invention.

Embodiments of the present invention may also be used to test the integrity of floating blocks that may not be tested after the completion of the circuitry.

As an illustration, floating driver including vertical parallel plate (VPP) or oxide/nitride/oxide (ONO) capacitors are used for blocking the bias voltages in the range of 5V to 9V. No overstress may be applied to the capacitors in functional operation, as they are coupled in parallel to a clamp. Referring to FIG. 8, if a potential is applied across the first capacitor C1 after fabricating the completed circuit, the zener diode ZD1 would clamp the applied voltage. Thus, it may not be possible to test the first capacitor C1 after the completion of all the production processes.

During operation, two gate voltages are generated by the clamps (e.g., MOS-diodes or Zener diodes) and supplied to the first transistor M1 and the second transistor M2. One bias voltage is a little bit higher than the other.

The first and the second capacitors C1 and C2 provide an energy source during the time that the driver is pushed below ground and no interface (bias current) from the ground related domain is working. During this time, the bias voltages are fully supplied by the blocking capacitors (first and second capacitors C1 and C2). Here also the same technique can be used as for regulator blocking capacitors.

A plurality of jumpers indicates the locations of the connections made after the inline testing. Thus, a first jumper J1 separates the zener diode ZD1 from the first capacitor C1. A second jumper J2 separates the first transistor M1 from the zener diode ZD1 and the first capacitor C1 during testing. A third jumper J3 separates the diode D1 from the current source, and a fourth jumper J4 separates the diode D1 from the second transistor M2 during testing. In various embodiments, the jumpers are added so as to complete the connections of the circuit after the inline testing of the capacitors is completed.

As a consequence, in various embodiments, the first capacitor C1 and the second capacitor C2 may be tested during inline metal testing before the jumpers complete the circuit.

By applying a voltage between the supply side pad 310 and the ground side pad 320, the second capacitor C2 can be fully stressed. Due to the voltage drop at the diode D1, first capacitor C1 is stressed by a slightly reduced voltage. However, the diode D1 is not destroyed by the applied test voltage, which may be higher than the operating voltage of the diode D1. The measurement of the first capacitor C1 will include a diode leakage current and therefore be more noisy than the measurement of the second capacitor C2. In contrast, it may not be possible to test the first capacitor C1 after the circuit is completed. Despite the increased noise, a fail of the first capacitor C1 and/or the second capacitor C2 can be detected during the stress testing by a leakage measurement during testing or after the application of the test bias during a functional test.

After the inline testing is completed, the jumpers are produced and the first and the second capacitors C1 and C2 are connected to the circuit. Additionally, the area penalty of introducing the extra pads for the inline testing may be negligible compared to the large area of the capacitors.

Embodiments of the present invention may be applied to any blocks with large capacitors that cannot be stressed in the functional mode, e.g., large sample caps in SC circuits, charge pump capacitors and buffer capacitors at any bias/reference voltage, which have a large distributed net with many parallel capacitors. In various embodiments, a virtual node for adding an extra pad may be defined for any part of the circuit enabling selective testing of different components.

Figure 9:
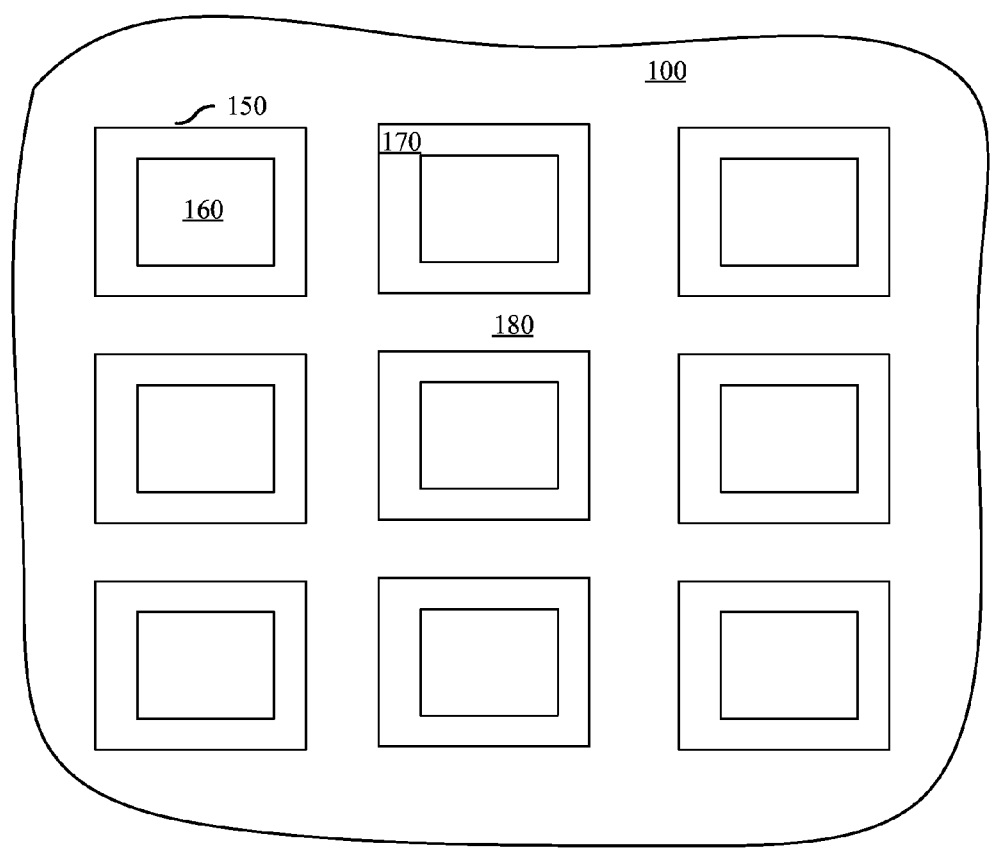
FIG. 9 illustrates location of the contact pads used during inline testing in accordance with embodiments of the present invention.

FIG. 9 illustrates the location of the contact pads in accordance with embodiments of the present invention.

In various embodiments, the contact pads added to the virtual node for testing may be located to minimize interference with existing circuit designs, i.e., metallization schemes for the circuit. FIG. 9 illustrates a substrate 100 comprising a plurality of chips 150. The substrate 100 is a semiconductor wafer in or more embodiments. In some embodiments, the substrate 100 may be a reconstituted wafer, for example, an encapsulant material holding the plurality of chips.

In various embodiments, the contact pads may be located outside the active region 160 of the chip 150 in various embodiments. In one or more embodiments, the contact pads may be located at the chip periphery 170, for example, outside the active region 160, or alternatively outside the chip 150, for example, in a dicing street 180 between adjacent chips 150. However, the external pad may also be added directly above active regions 160 in some embodiments especially if the area of the pads is smaller than the area of the capacitors, which may provide sufficient space to introduce extra pads.

In various embodiments, the extra pads may be covered with a passivation layer to prevent accidental shorting or application of potential through the extras pads previously introduced for inline testing.

Figure 10A:
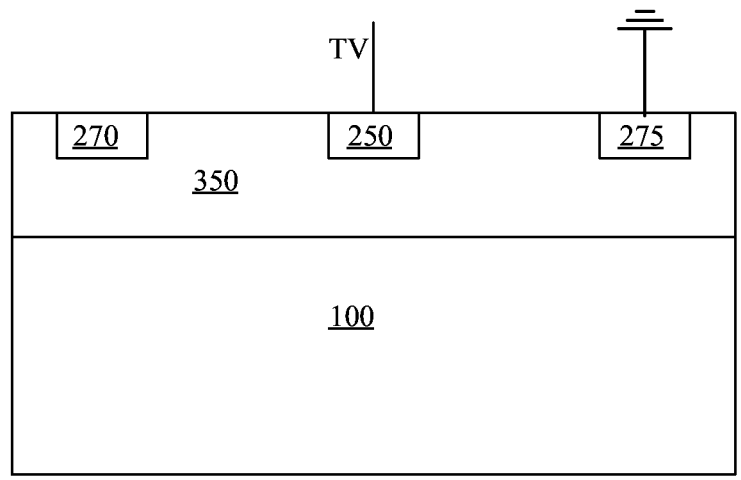
FIGS. 10A and 10B, illustrates cross-sectional views of a semiconductor device during various stages of processing in accordance with embodiments of the present invention.
Figure 10B:
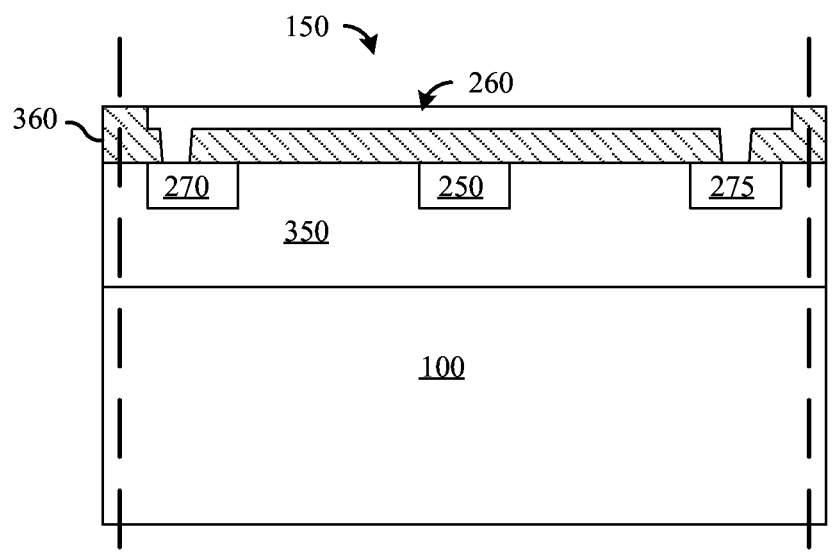

FIG. 10, which includes FIGS. 10A and 10B, illustrates cross-sectional views of a semiconductor device during various stages of processing in accordance with embodiments of the present invention.

First front end of the line processing is performed. Front end of the line processing includes forming the active regions, diffusion regions and other regions within the semiconductor substrate 100.

Referring to FIG. 10A, a substrate 100 may include one or more devices formed within active regions. The substrate 100 may include a semiconductor substrate and/or a dielectric layer over a semiconductor substrate in various embodiments. In various embodiments, the substrate 100 is a wafer, e.g., silicon wafer, within/over which a large number of chips will be fabricated.

FIG. 10A illustrates the semiconductor device after forming the components to be tested as well as other functional blocks. For example, the capacitors 210, and the circuit blocks 220 (described in FIGS. 4-8) are fabricated within/over the substrate 100.

Subsequently, back end of the line processing is performed. Back end of the line processing includes the metallization processes to interconnect the various components or devices in the semiconductor substrate 100.

In various embodiments, the metal lines may be formed using a subtractive process or an additive process such as a damascene process. For example, aluminum is deposited using a subtractive process while copper is deposited using an additive process. In a subtractive process, a blanket layer of metal is deposited, which is then structured using lithography and etch process. In contrast, in an additive process, an insulating layer is patterned to form openings, which are then filled with a metal, for example, using a plating process.

The separated ground line 270 and the ground line 275 are illustrated in FIG. 10A, which are formed within the metallization layers 350 over the substrate 100.

At this stage of processing, as illustrated in FIG. 10A, the external contact pads 250 added for contacting the components to be tested may be exposed. The inline testing may performed by applying a test voltage pulse (TV) at the contact pad 250 while grounding the other pads such as the ground line 275.

Referring to FIG. 10B, after the testing, a dielectric layer 360 may be formed over the substrate 100. Another metal level may be formed in the dielectric layer 360. In some embodiments, this metal level may be the uppermost metal level. The metal level includes various interconnects to complete the circuitry of the semiconductor device. For example, the jumpers including interconnect 260 (FIGS. 4-8) may be formed connecting the separated ground line 270 with the ground line 275.

After completion of any remaining metal levels and necessary passivation layers, the substrate 100 may be singulated to form individual semiconductor chips 150.

Figure 11:
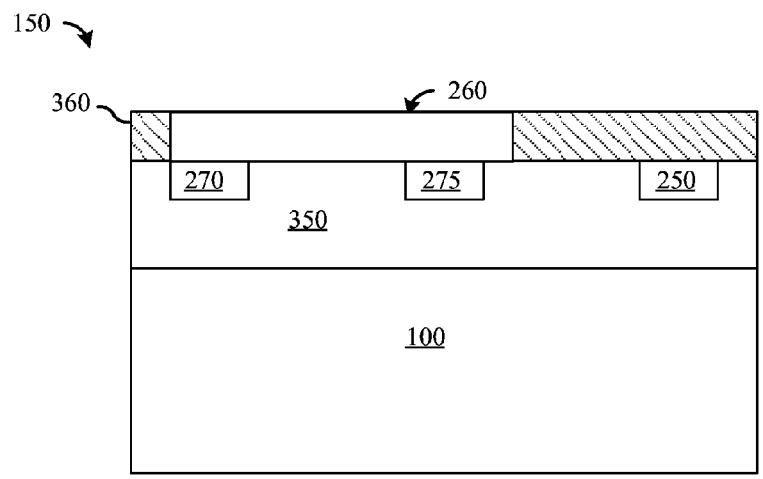
FIG. 11 illustrates cross-sectional view of a semiconductor device with a thick metal layer used for completing the circuit after the inline testing in accordance with embodiments of the present invention.

FIG. 11 illustrates a cross-sectional view of a semiconductor device with a thick metal layer used for completing the circuit after the inline testing in accordance with embodiments of the present invention.

In this embodiment, a thick metal level may be used for forming the jumpers that complete the circuitry of the semiconductor device. For example, the thick metal layer may be a power copper in some embodiments.

Figure 12:
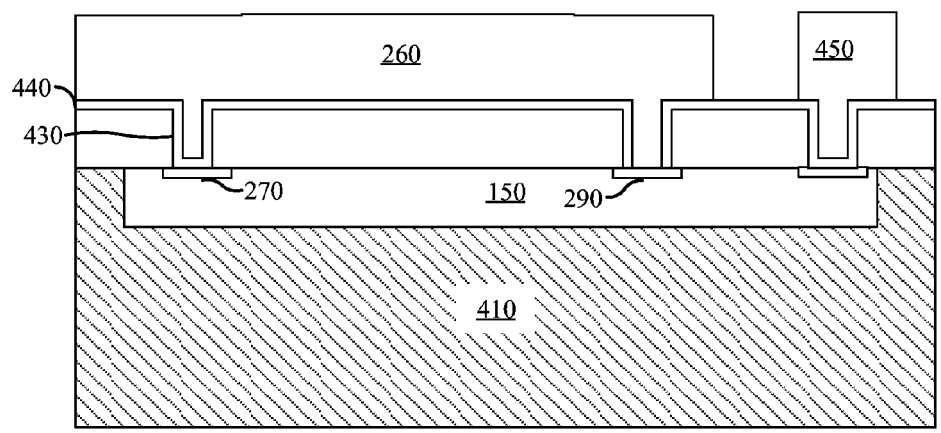
FIG. 12 illustrates an alternative embodiment of the present invention in which at least part of the processing is performed in a wafer level processing.

FIG. 12 illustrates an alternative embodiment of the present invention in which at least part of the processing is performed in a wafer level processing.

The testing of the substrate 100 may be performed as described using FIG. 10A. Subsequently, after completion of all back end of the line processing and singulation, a reconstituted wafer is formed for wafer level processing. The reconstituted wafer includes an encapsulant 410 supporting a plurality of chips 150. A plurality of vias 430 may be formed by depositing a conductive lines 440 followed by the deposition of a conductive metal to form jumpers such as the interconnect 260 (FIGS. 4-8) and redistribution lines 450. Thus, in various embodiments, the interconnect 260 may be formed during the formation of redistribution lines 450.

Figure 13:
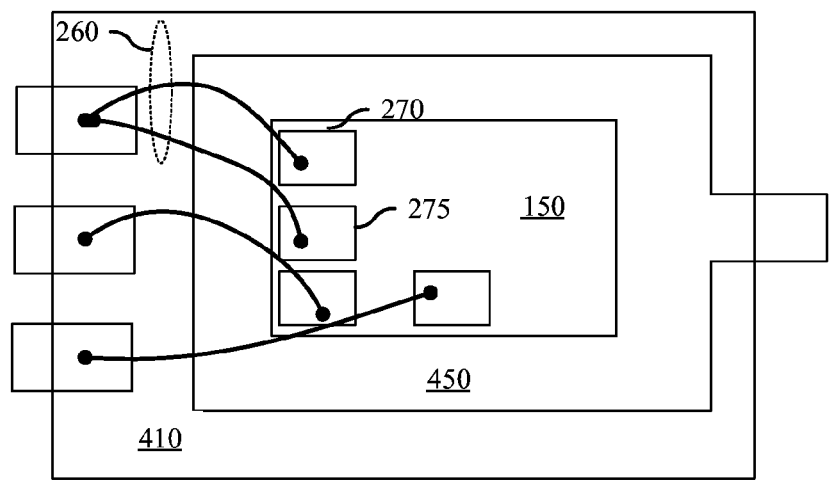
FIG. 13 illustrate an alternative embodiment of the present invention in which the jumpers are formed during packaging.

FIG. 13 illustrate an alternative embodiment of the present invention in which the jumpers are formed during packaging.

In one or more embodiments, the circuit may be completed during packaging. For example, the separated ground line may be joined together using the package interconnects. FIG. 13 illustrates an example in which the wire bonds of the lead frame package form the interconnect 260 connecting the pads of the separated ground line 270 of the component being tested with the ground line 275 coupled to other functional blocks. The lead frame includes a die paddle 450 that is embedded in an encapsulant 410. The die paddle 450 also supports the semiconductor chip 150 and may also form one of the contacts to the chip 150. A plurality of leads includes an external portion protruding out of the lead frame package.

Figure 14:
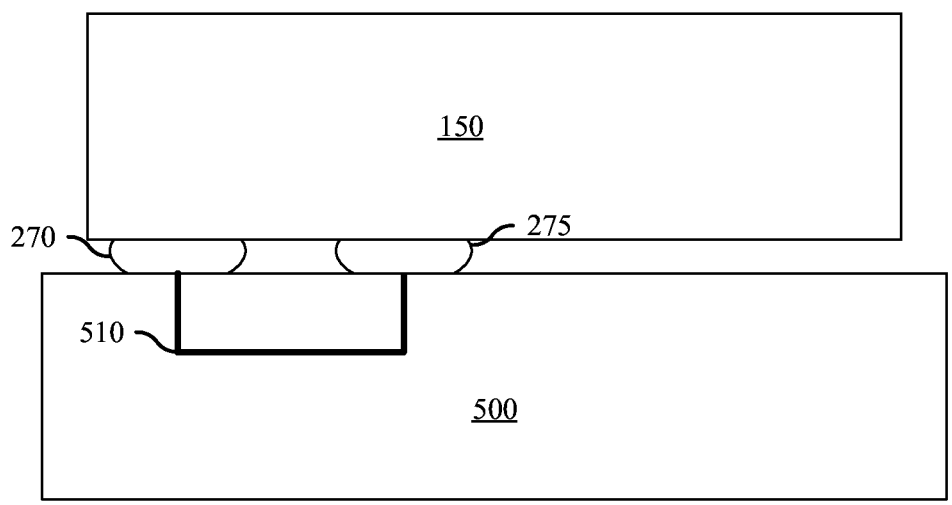
FIG. 14 illustrate an alternative embodiment of the present invention in which the jumpers are attached using a printed circuit board.

FIG. 14 illustrate an alternative embodiment of the present invention in which the jumpers are attached using a printed circuit board.

FIG. 14 illustrates a chip 150 attached to a printed circuit board (PCB) 500. The chip may have solder balls coupled to separated ground line 270 and ground line 275. In one or more embodiments, the chip 150 may be attached using flip-chip process. The separated ground line 270 and ground line 275 may be coupled through a PCB interconnect 510.

Figure 15:
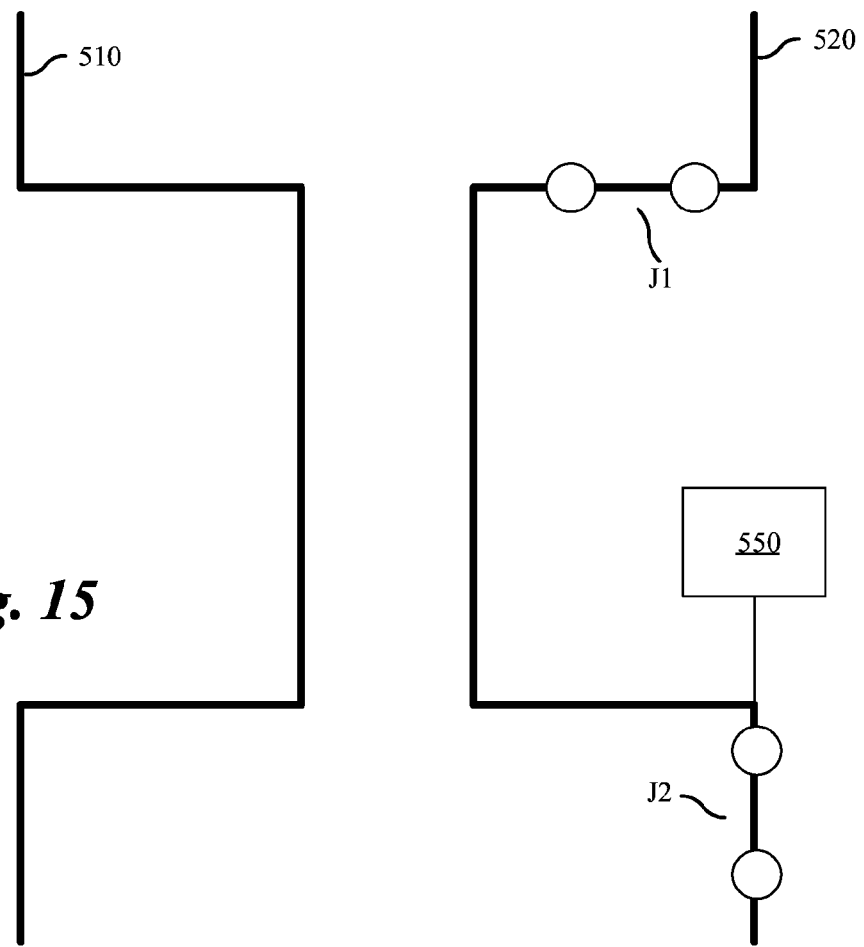

FIG. 15 illustrates applying embodiments of the present invention to metal line structures. FIG. 15 illustrates a top view of two metal lines formed in a same metal level.

Embodiments of the present application may not only be applied to capacitors, but also to any other device or even interconnects (metal lines and/or vias), which are critical, e.g., safe design power lines, safe isolation of deep trench contact, and shallow trench isolation or field oxide regions. Further, embodiments of the present invention may be applied to any type of connection line and not just a ground line. For example, components tied to a common connection line, which may even be at a floating potential, may be separated from each other during fabrication, tested and joined again.

FIG. 14 illustrates such a possibility for illustration. A first metal line 510 and a second metal line 520 are formed over a substrate and include a region over which they are designed close to each other. For example, the first metal line 510 may be a power line intended to carry a large voltage while the second metal line 520 may be a ground line. The isolation between the first metal line 510 and the second metal line 520 may be tested using embodiments of the present invention described above.

For example, a first jumper and a second jumper may be added isolating the second metal line 520. In response to a test voltage pulse applied at the test pad 550, the leakage current between the first metal line 510 and the second metal line 520 may be measured through the test pad 550. After the measurement, the first and the second jumpers J1 and J2 are connected in a subsequent metallization to complete the circuit.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2, 4-14 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    performing a test during the forming of the semiconductor device within and/or over a substrate, the test comprising:
        applying a first voltage to a first node coupled to a component to be tested in the substrate and a test voltage at a pad coupled to the component to be tested through a second node, wherein the test voltage has a peak voltage higher than the first voltage, wherein the component to be tested is coupled between the first node and the second node, and measuring a leakage current through the component to be tested in response to the test voltage; and after performing the test, connecting the second node to a functional block in the substrate, wherein the first node is coupled to a third node coupled to the functional block.

2. The method of claim 1, wherein connecting the second node to the functional block comprises forming a metal layer over the substrate.

3. The method of claim 1, wherein connecting the second node to the functional block comprises using wire bonding.

4. The method of claim 1, wherein connecting the second node to the functional block comprises using a printed circuit board.

5. The method of claim 1, wherein connecting the second node to the functional block comprises forming a metal line for the connecting at the same time as forming redistribution lines during a wafer level process.

6. The method of claim 1, further comprising applying a second voltage to a fourth node coupled to the functional block, wherein the functional block is coupled between the third node and the fourth node.

7. The method of claim 6, wherein the first voltage is a supply voltage configured to power the functional block during operation, wherein the second voltage is a ground voltage.

8. The method of claim 6, wherein the first voltage is a ground voltage, and wherein the second voltage is a ground voltage.

9. The method of claim 1, wherein the second node is a floating potential node after the connecting.

10. The method of claim 9, wherein the second node is coupled to the pad through a device configured to propagate the test voltage without breakdown.

11. The method of claim 9, wherein the component to be tested is a capacitor.

12. The method of claim 11, wherein the capacitor is part of a charge pump capacitor, a switched capacitor, or a buffer capacitor.

13. The method of claim 9, wherein the component to be tested are adjacent metal lines.

14. The method of claim 1, wherein based on the measurement of the leakage current, determining the semiconductor device passed the test.

15. The method of claim 1, wherein based on the measurement of the leakage current, determining the semiconductor device failed the test.

16. A method of performing an test of a semiconductor device during fabrication, the method comprising:

identifying a first pad of a component to be tested over a substrate, wherein the component to be tested is configured to be coupled with a functional block in the substrate, wherein the component to be tested is coupled between a first potential node and the first pad, wherein the functional block is coupled between the first potential node and a second pad;

applying a test voltage at the first pad, a first voltage at the second pad, and a second voltage at the first potential node;

measuring a leakage current in response to the test voltage; and after the testing, connecting the first pad to the second pad.

17. The method of claim 16, wherein the component to be tested is marked as failing the test based on the measured leakage current.

18. The method of claim 17, wherein the component to be tested is marked as passing the test based on the measured leakage current.

19. The method of claim 16, wherein connecting the first pad to the second pad comprises forming a metal line over the first pad and the second pad.

20. The method of claim 19, wherein forming the metal line comprises:

depositing a metal layer over the substrate.

21. The method of claim 20, further comprising:

depositing a photo resist layer over the metal layer;

patterning the photo resist layer; and etching the metal layer using the patterned photo resist layer as a etch mask to form the metal line.

22. The method of claim 20, further comprising using a damascene process to form the metal line.

23. The method of claim 20, further comprising dicing the substrate after forming the metal line.

24. The method of claim 16, wherein the magnitude of a peak voltage of the test voltage is higher than the magnitude of the first voltage.

25. The method of claim 16, wherein the ratio of magnitude of a peak voltage of the test voltage and the magnitude of a supply voltage configured to be applied at the first potential node during operation is between 1.1:1 to about 10:1.

26. The method of claim 16, wherein the component to be tested is a capacitor.

27. The method of claim 26, wherein the capacitor is coupled to the pad through a device configured to propagate the test voltage without breakdown.

28. A method of testing a semiconductor device, the method comprising:

providing a substrate comprising a plurality of semiconductor devices, a first device of the plurality of semiconductor device comprising a first circuit coupled to a first line and a second circuit coupled to a second line;

performing an inline test on a semiconductor device, the inline test comprising:

applying a first potential at the first line and a different second potential at the second line;

measuring a leakage current through the first line; and determining whether the first device passed or failed the inline test based on the measured leakage current.

29. The method of claim 28, further comprising:

connecting the first line to a common ground line.

30. The method of claim 28, further comprising:

connecting the first line to a common supply line.

31. The method of claim 28, further comprising dicing the substrate after performing the inline testing.

* * * * *